United States Patent
Karner et al.

(10) Patent No.: US 6,685,994 B1
(45) Date of Patent: Feb. 3, 2004

(54) COATING WORKPIECE METHOD USING BEAM OF PLASMA

(75) Inventors: Johann Karner, Feldkirch (AT); Mauro Pedrazzini, Eschen (LI); Christoph Hollenstein, Lutry (CH); David Franz, Lausanne (CH)

(73) Assignee: Unaxis Balzers Aktiengesellschaft, Furstentum (LI)

( * ) Notice: Subject to any disclaimer, the term of this patent is extended or adjusted under 35 U.S.C. 154(b) by 0 days.

(21) Appl. No.: 10/031,258

(22) PCT Filed: Apr. 11, 2000

(86) PCT No.: PCT/CH00/00208
§ 371 (c)(1),
(2), (4) Date: Feb. 5, 2002

(87) PCT Pub. No.: WO00/66806
PCT Pub. Date: Nov. 9, 2000

(30) Foreign Application Priority Data

Apr. 29, 1999 (CH) ................................................ 794/99

(51) Int. Cl.$^7$ ................................................ H05H 1/24
(52) U.S. Cl. ........................ 427/569; 427/571; 427/578
(58) Field of Search ................................. 427/569, 578, 427/571

(56) References Cited

U.S. PATENT DOCUMENTS

| | | | | | |
|---|---|---|---|---|---|
| 5,494,712 | A | * | 2/1996 | Hu et al. | 427/489 |
| 5,616,373 | A | * | 4/1997 | Karner et al. | 427/577 |
| 5,624,725 | A | * | 4/1997 | Nelson et al. | 428/65.5 |
| 5,858,477 | A | * | 1/1999 | Veerasamy et al. | 427/562 |
| 5,888,593 | A | * | 3/1999 | Petrmichl et al. | 427/563 |
| 5,897,942 | A | * | 4/1999 | Karner et al. | 428/213 |
| 6,211,622 | B1 | * | 4/2001 | Ryoji et al. | 315/111.21 |

* cited by examiner

Primary Examiner—Bret Chen
(74) Attorney, Agent, or Firm—Notaro & Michalos P.C.

(57) ABSTRACT

Method for coating workpieces generates a beam of a plasma in an evacuated container. A region of highest plasma density is at the beam axis and workpieces having surfaces to be coated, are radially offset from, and extend along the axis with the surfaces facing the axis and being in the container. Fresh reactive gas is inlet into the container and consumed gas is removed from the container. Coating material is deposited upon the surfaces with a deposition rate of at least 400 nm/min and at a maximum temperature of the surfaces being 550° C.

29 Claims, 2 Drawing Sheets

COATING WORKPIECE METHOD USING BEAM OF PLASMA

Figure 1:
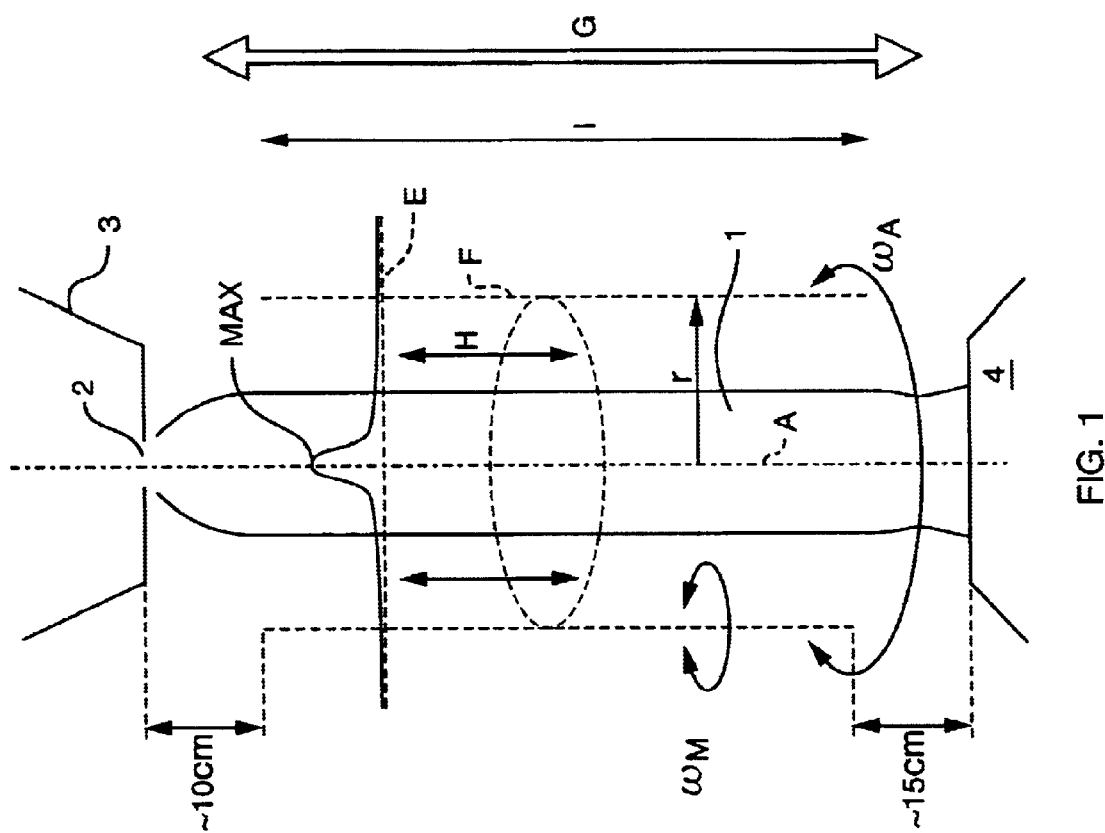

The present invention fundamentally has the goal of depositing materials with reactive plasma-enhancement i.e. by a PE-CVD method, on a deposition surface, on the one hand with maximally high deposition rate onto the deposition surface, on the other hand, at minimally low temperature of this surface.

We define the deposition rate as the material thickness applied onto a surface per unit time, if said surface is disposed within the vacuum container at a defined site yet to be explained, since, in particular in the present context, the quantity of material deposited onto a surface unit per unit time is a function of the location at which the surface is disposed.

It is known from "Plasma-Enhanced Chemical Vapour Deposition of Epitaxial Silicon from Silan", S. R. Shanfield et al., 1046 B, Extended Abstracts, Vol. 83-1 (1983), May, Pennington, N.J., USA; XP-002056339, to deposit epitaxial silicon layers by means of PE-CVD, with silane as the reactive gas. Therein a substrate temperature between 700° and 900° results. Coating rates (FIG. 3) of maximally 40 nm/min are achieved.

From "Low Temperature Deposition of Microcrystalline Silicon in a Multipolar Plasma", T. D. Maintei et al., 1046 B Extended Abstracts, (1985), October, No. 2, Pennington, N.J., USA; XP-002056340, is further known to deposit microcrystalline silicon layers with a PE-CVD method at coating rates up to approximately 40 nm/min at a surface temperature of 100° C. and up to approximately 25 nm/min at a surface temperature of 250° C.

From DE-OS 36 14 384 by the same applicant as the present application it is known to attain by means of a PE-CVD method using a low-voltage high-current arc discharge coating rates of 200 nm/min in the coating with nickel in $Ni(CO)_4$ gas as the highest deposition rate specified there. Si is therein only deposited at a coating rate of approximately 17 nm/min. With the aid of the low-voltage discharge a homogeneous dense plasma is generated in the vacuum container.

According to "Plasma-Assisted CVD of Diamond Films by Hollow Cathode Arc Discharge", J. Stiegler et al., Diamond and Related Materials, 2 (1993), 413–416, it is known to deposit diamond layers with a PE-CVD method at a deposition rate of up to approximately 35 nm/min at surface temperatures of at least 700° C.

Furthermore known from "Low Temperature Plasma-Enhanced Epitaxy of GaAs", K. P. Pande, 1046 Journal of the Electrochemical Society, 131 (1984), June, No. 6, Manchester, N.H., USA, is to deposit GaAs epitaxial layers at low temperatures below 400° C., however, at deposition rates of 80 nm/min, however only starting at temperatures about 500° C.

U.S. Pat. No. 5,554,222 discloses depositing diamond-like layers at relatively cold deposition surface temperatures of 250° C. when cooled, and 400° C. when not cooled. Deposition rates of 20 nm/sec were reported.

From PCT/CH98/00221 by the applicant of the present application it is further known to attain by means PE-CVD deposition rates of approximately between 100 and 200 nm/min, depending on the deposition materials, at surface temperatures between 300° and 800° C.

It is the task of the present invention to propose a method for the reactive plasma-enhanced deposition of material onto a deposition surface, by means of which at low temperatures of the deposition surface, without it being cooled, significantly higher deposition rates are attained compared to such prior known PE-CVD methods.

This is achieved through the use of a method for the reactive plasma-enhanced treatment of workpieces, in which a plasma beam is generated in an evacuated container and workpieces are disposed radially offset with respect to the region of highest plasma density along the beam axis, with fresh reactive gas being allowed to flow into the container and consumed gas being suctioned from the container and surfaces to be treated identically are disposed equidistantly with respect to the beam axis for the deposition of material on a deposition surface with a material generation rate of at least 400 nm/min and at a temperature of maximally 550° C. However, significantly lower temperatures are therein possible.

From EP 0 724 026 by the same applicant as of the present invention, a method is known for the reactive treatment of workpieces in which a plasma beam is generated in an evacuated container, and radially offset with respect to the region of highest plasma density along the beam axis, are disposed workpieces, wherein fresh reactive gas being allowed to flow into the container and consumed gas is suctioned from the container, and in which, further, workpiece surfaces to be treated identically are disposed distributively about the plasma beam along a longitudinally extended surface of revolution, and specifically such that the plasma density on the surfaces is at most 20% of the maximum beam plasma density, viewed in each instance in planes perpendicular to the beam axis, which is suitable for depositing difficult to produce metastable layers, in particular of diamond, CBN, $\alpha$-$Al_2O_3$ or $C_3N_4$ layers. In this document it was found that the diffusion region of high-current arc discharges, i.e. the region of a plasma density of $\leq 20\%$ of the beam center plasma density, is extraordinarily well suited for the deposition of extremely hard layers, in particular for the deposition of layers out of metastable phases, such as the above, difficult of generation under normal conditions.

It was found according to the present invention that this advance is not only suitable for the deposition of layers difficult to produce, but, surprisingly for the deposition fundamentally at very high deposition rates and, as stated, while maintaining low temperatures.

The use according to the invention is especially suitable for the deposition of microcrystalline silicon, therein especially highly suitable of $\mu$c-Si:H.

In particular in this use it was found that with the content of hydrogen in the process atmosphere the temperatures of the treated workpieces can be set in a wide range, thus between temperatures above 400° C. down to temperatures above 250° C. The lower the hydrogen fraction, the lower is said temperature. Since this $H_2$ content in the formation of $\mu$c-Si:H is not particularly critical, this parameter is highly suitable as a temperature setting variable in particular when depositing this material to be used.

It should be emphasized that based on the prior known methods for very hard layers and in particular for said metastable phases which are difficult to produce, it is by no means evident that this method is suitable for the high-rate deposition, on the contrary.

The plasma beam in highly preferred manner and as described in EP 0 724 026, is developed as a low-voltage arc discharge, preferably as a high-current arc discharge.

In the use according to the invention, the deposition is used as a coating deposition or as deposition of the material in powder or cluster form, i.e. in the last cited case, to obtain said material powder or cluster. In order to carry out, furthermore, said deposition at a maximum degree of efficiency, i.e. utilized deposited quantities of material for each reactive gas quantity introduced, it is further proposed that the deposition surface is disposed along surfaces of revolution about the beam axis.

To attain maximally high efficiency with respect to the deposited quantities of material and introduced reactive gas, it is further proposed to dispose the deposition surface, be that developed by a collector surface for the deposited powder or cluster, be that formed by workpiece surfaces to be coated, annularly about the axis of the plasma beam.

In particular, if, as in the application of the use according to the invention for surface coating, the deposition thickness homogeneity is an essential criterium, it is further proposed to rotate the deposition surface about the beam axis and/or about an axis of rotation offset from the beam axis, preferably parallel hereto, during the deposition.

Homogenization of the deposition distribution is also attained through a reactive gas flow in the container generated substantially parallel to the beam axis.

In a further, highly preferred embodiment of the use according to the invention, the plasma density distribution is controlled by means of a magnetic field generated substantially parallel to the beam axis. If such a field is applied, then preferably of maximally 250 Gauss, preferably of 100 Gauss, in particular preferred of 60 Gauss.

Depending on the application purpose, the deposition surface can be placed at floating potential or at a preferably settable electric potential, therein to a DC, an AC or an AC+DC potential.

The plasma beam is further in a preferred embodiment generated by means of a low-voltage arc discharge with hot cathode or with cold cathode, preferably as a high-current arc discharge. Especially preferred and essential for the development in particular of the low-voltage/high-current arc discharge the total pressure in the container is maintaining at minimally 1 mbar.

The use according to the invention in the highly preferred embodiment is aiming for the deposition of microcrystalline silicon, in particular of $\mu$c-Si:H, wherein preferably silane is employed as the reactive gas. It is therein in particular also essential that according to the invention microcrystalline silicon can be deposited in nm up to $\mu$m powder or cluster form. With said high deposition rate, furthermore, as layer or powder, further silicon compounds can be deposited, such as SiC, SiN, but additionally also metal compound layers, such as in particular hard substance layer materials, such as for example TiN, TiAlN, SiAlON layers or layers with low coefficients of friction, such as CrC-, FeC-, WCC layers etc. In spite of the high deposition rates, in the deposition as coating a high coating quality suitable for epitaxial layer formation is obtained.

Furthermore, with the use according to the invention industrially widespread silicon or glass substrates are preferably coated.

Figure 2:
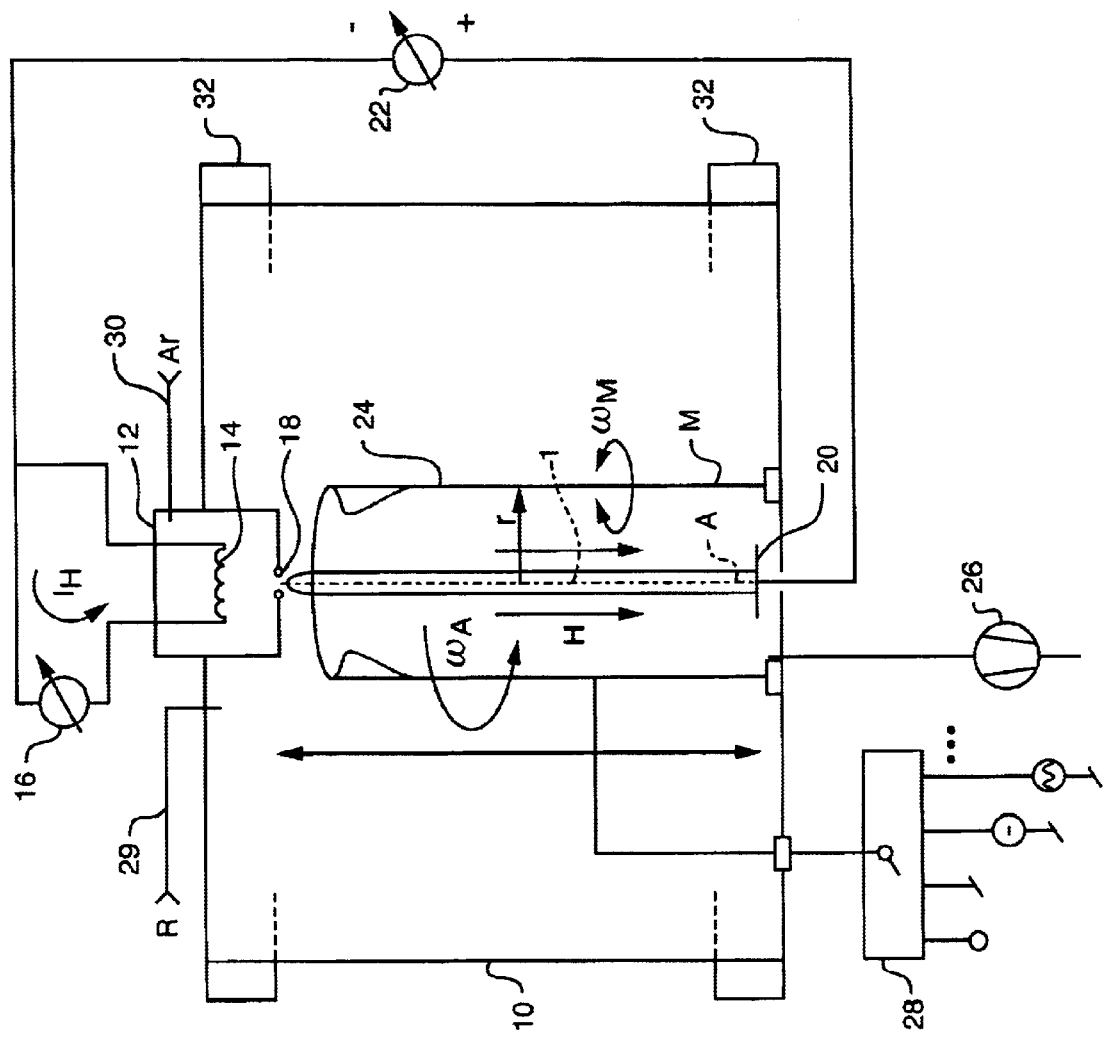

In the following, the invention will be explained by example in conjunction with figures and examples, and, with respect to the prior known advance applied according to the invention, reference is made to the EP-A 0 724 026 forming an integrated component of the present specification. In the Figures depict:

FIG. 1 schematically, a high-current arc and the disposition according to the invention with respect to it of deposition surfaces, FIG. 2 schematically an installation used according to the invention for the preferred deposition according to the invention of microcrystalline silicon.

In conjunction with FIG. 1, first the fundamental advance according to the invention will be explained. The plasma beam preferably developed as high-current arc 1 diverges rapidly within a few cm after a nozzle-opening of a cathode chamber 3 to a certain expansion in order to retain a largely constant development up to shortly before the anode, up to a few cm in front of it. The expansion of the arc before the anode depends on the geometric form of the anode. Except for a small region after the diaphragm opening 2 and over the anode 4, a largely homogeneous long region 1 of the high-current arc consequently results. Along the axis A in the diametrical cutting plane E, such as plotted by example, bell-shaped curve distributions of the plasma density result. The plasma density distribution has in each plane E a maximum Max.

For the use according to the invention the arc length is preferably between 50 and 120 cm, in particular preferred approximately 90 cm.

For the use according to the invention, further, the total pressure in the container is selected to be greater than 1 mbar. The surfaces to be provided according to the invention for the deposition of materials, are preferably disposed in a radius r from the beam axis A, at which maximally a plasma density of 20% obtains.

The width of the plasma beam, and thus also the distribution of the plasma density, is set according to the particular requirements via the setting of the arc current and/or in particular via an axial magnetic field H, as shown in FIG. 1.

The field strength is therein preferably set to maximally 250 Gauss, but in particular to maximally 100 Gauss, but especially highly preferred between 0 Gauss (without field) and 60 Gauss.

Due to the disposition of the deposition surfaces in the region of low plasma density, the advantage is also obtained that this varies only slightly along straight lines parallel to the beam axis and in the homogeneous region 1.

For this purpose the distance r of the workpiece surfaces to be treated from the beam axis A is preferably selected to be $$6 \text{ cm} \leq r \leq 20 \text{ cm},$$

in particular to be $$9 \text{ cm} \leq r \leq 13 \text{ cm},$$

As depicted further in FIG. 1, relatively large deposition surfaces to be used, and in particular such surfaces on which a coating is to be generated, are moved preferably oscillating or revolving with respect to axes parallel to the beam axis, as shown with $\omega_M$, and/or optionally about the beam axis A, as shown with $\omega_A$. Furthermore, the reactive gas flow, as shown with G, is preferably generated substantially parallel to the beam axis A.

In FIG. 2 an installation according to the invention is shown schematically. The plasma beam 1 is preferably generated as a high-current arc discharge in a vacuum container 10, preferably in the form of a hot cathode low-voltage high-current arc discharge, however wherein also a cold cathode arc discharge can be employed.

Onto the vacuum container 10 is flanged a cathode chamber 12 with an electron-emitting hot cathode 14, which is connected into a heating current circuit for the heating current $I_H$ with preferably settable heating current generator 16.

Opposing a beam exit nozzle 18 provided on the cathode chamber 12, is disposed the anode 20. Between a hot cathode 14 or the heating current circuit and anode the preferably settable discharge generator 22 is connected. With respect to details of this known configuration, reference can be made to CH 664 768 in addition to EP-0724 026.

A workpiece support configuration 24 defining a cylindrical surface is provided for deposition surfaces to be coated with the use according to the invention or as a collecting surface for the deposition of material powder or clusters. The radius r, as was evident based on the above explanations, depends on the beam power.

Along the cylindrical workpiece support configuration, while observing said plasma density conditions, workpieces to be coated, such as, in a preferred embodiment, glass or silicon substrates, are provided. They are provided in particular for the high-rate deposition of microcrystalline silicon. But other workpieces, such as tools, for example, drills, indexable inserts, milling cutters etc. can also be disposed thereon in order to coat them with hard substance layers such as layers comprised of TiN, TiAlN, Si—Al—ON, SiC, SiN, etc. or with layers with low coefficients of friction, such as with layers comprised of CrC, FeC, WCC, thus for example metal-carbon layers. In order to utilize the reactive gases as efficiently as feasible, optionally provided substrate supports are built to be as transparent as possible such that the main surface is formed by the workpieces or substrates themselves and not by their mounting support.

As can furthermore be seen in FIG. 2, reactive gas R, preferably silane, for the preferred embodiment, namely the deposition of microcrystalline silicon is introduced at 29 into the container 10; at the anode side the pumping configuration 26 is provided. Thereby a gas flow directed substantially parallel to axis A through the container and along the deposition surface 24 disposed on a cylindrical surface is set up. Via a support configuration workpieces or generally deposition surfaces are operated at a floating potential or connected to a reference potential, for example ground potential, or connected to a DC bias potential, an AC or a mixed AC+DC potential, such as for example to a pulsed DC potential. This and further options of potential connections for the deposition surfaces are shown in FIG. 2 schematically with the change-over unit 28. The installation according to FIG. 2 was coated for the examples 1 to 6 according to the following Table.

In all examples $\mu$c-Si:H structures were deposited, directed onto the employed glass or silicon substrates. The layers had to some extent epitactic qualities. It should be noted that in none of the layers an amorphous intermediate layer was generated directly on the substrate. This is unusual since in conventional coating methods normally an amorphous intermediate silicon layer is initially always formed, which subsequently prevents epitaxial layers from growing on. This indicates that the method employed according to the invention is also suitable for the deposition of epitaxial layers. Noticeable is further the extremely high growth rate which is attained even at low deposition temperatures.

In general, for the use according to the invention the following operating parameters can be specified:

| | |
|---|---|
| Arc current: | 80–170 A |
| Total pressure: | 1 mbar $\leq$ P$_{tot}$ $\leq$ 3 mbar |
| Axial magnetic field H: | 0–250 Gauss, preferably 0–100 Gauss, especially advisable 0–60 Gauss. |

Distance r from the beam axis to the workpiece surface:

| | |
|---|---|
| preferred is | 6 cm $\leq$ r $\leq$ 20 cm, 9 cm $\leq$ r $\leq$ 13 cm. |

For the preferred application, namely the deposition of microcrystalline silicon, further, at a container size of approximately 80 l and an arc length, dimensioned as specified, of 90 cm according to the above examples, the following gas flows were employed:

| | |
|---|---|
| Argon: | 1800 sccm |
| H$_2$: | 0–100 sccm |
| Silane, SiH$_4$: | 5–100 sccm |

Substrate temperatures were attained which are not higher than 450° C., customarily between 250 and 500° C.

Depending on the set arc current, to maintain the conditions of plasma density, preferably of maximally 20% of the maximal density at the beam axis, radial distances are

| | Example 1 | Example 2 | Example 3 | Example 4 | Example 5 | Example 6 |
|---|---|---|---|---|---|---|
| Process Parameters | | | | | | |
| Arc current [A] | 100 | 160 | 400 | 120 | 120 | 120 |
| Magnetic field [Gauss] | 50 | 80 | 60 | 0 | 0 | 30 |
| Total pressure [mbar] | 1.5 | 1.5 | 2.0 | 1.5 | 1.5 | 1.5 |
| Gas flows [sccm] | | | | | | |
| Ar | 1800 | 1800 | 1600 | 2700 | 2700 | 2700 |
| H$_2$ | 20 | 50 | 40 | 50 | 40 | 0 |
| SiH$_4$ | 60 | 100 | 100 | 75 | 80 | 100 |
| Distance from arc axis [cm] | 16 | 10 | 16 | 7 | 10 | 9 |
| Substrate temperature [° C.] | 250 | 350 | 450 | 450 | 400 | 420 |
| Coating time [min] | 40 | 80 | 20 | 16 | 25 | 24 |
| Growth rate [nm/min] | 450 | 600 | 600 | 630 | 400 | 500 |
| Arc length [cm] | 90 | 90 | 90 | 50 | 50 | 50 |
| Layer properties | | | | | | |
| Layer thickness [$\mu$m] | 18 | 48 | 12 | 10 | 10 | 10 |
| Crystal structure | $\mu$c-Si:H | $\mu$c-Si:H | $\mu$c-Si:H | $\mu$c-Si:H | $\mu$c-Si:H | $\mu$c-Si:H | obtained from the beam axis between 6 and 20 cm, preferably, as stated, of 9 to 13 cm.

Depending on the setting of the operation parameters, in particular during the deposition of microcrystalline silicon, said layers are obtained as coatings or as deposition in the form of powder or clusters of nm to μm size.

As a function of the hydrogen content of the treatment atmosphere, further, at a total pressure of 1.5 mbar, without a magnetic field being applied, further with r=10 cm, an arc current of 120 A as well as a constant argon flow of 1800 sccm, the following relationship was measured:

| $H_2$ flow (sccm) | Temperature at deposition surface (° C.) |
|---|---|
| 10 | 220 |
| 30 | 270 |
| 50 | 310 |
| 70 | 350 |
| 100 | 390 |
| 150 | 450 |

Based thereon, it is evident that the hydrogen content in the treatment atmosphere is extraordinarily well suited to set the deposition temperature at the workpiece surfaces.

What is claimed is:

1. A method for coating workpieces comprising the steps of:
    generating a beam of a plasma in an evacuated container having, along an axis of said beam, a region of highest plasma density;
    disposing workpieces having surfaces to be coated, radially offset from, and extending along said axis with said surfaces facing said axis;
    inletting fresh reactive gas into said container and removing consumed gas from said container; and
    depositing coating material upon said surfaces with a deposition rate of at least 400 nm/min and at a maximum temperature of said surfaces of 550° C.

2. The method as claimed in claim 1, including deposition the coating material as one of a powder and a cluster.

3. The method as claimed in claim 1, wherein said plasma beam is a low-voltage arc discharge.

4. The method as claimed in claims 3, wherein said plasma beam is a low-voltage and a high-current arc discharge.

5. The method as claimed in claim 1, including rotating said workpiece surfaces around said beam axis.

6. The method as claimed in claim 1, including oscillatingly pivoting said workpiece surfaces around a further axis that is offset with respect to said beam axis.

7. The method as claimed in claim 6, wherein said further axis is parallel to said beam axis.

8. The method as claimed in claim 1, including oscillatingly pivoting said workpiece surfaces around a said beam axis.

9. The method as claimed in claim 1, wherein said fresh reactive gas is inlet substantially parallel to said beam axis.

10. The method as claimed in claim 1, wherein the distribution of the plasma density is set by means of a substantially axially parallel magnetic field.

11. The method as claimed in claim 10, wherein the magnetic field has a strength of between zero and 250 Gauss.

12. The method as claimed in claim 11, wherein the magnetic field has a strength of 100 Gauss at most.

13. The method as claimed in claim 12, wherein the magnetic field has a strength of between zero and 60 Gauss.

14. The method as claimed in claim 1, wherein said plasma beam is generated as a high-current arc by means of a hot cathode discharge with cathode chamber with exit nozzle or with a cold cathode.

15. The method as claimed in claim 1, wherein said workpiece surfaces are at floating potential.

16. The method as claimed in claim 1, wherein said workpiece surfaces are at a settable electric potential that is at one of a DC, an AC, or an AC plus DC potential.

17. The method as claimed in claim 1, wherein said plasma beam has a length of more than 50 cm.

18. The method as claimed in claim 1, including deposition at least one silicon compound as said coating material.

19. The method as claimed in claim 18, wherein said at least one silicon compound is microcrystalline silicon μc-Si:H.

20. The method as claimed in claim 19, wherein said reactive gas is silane.

21. The method as claimed in claim 20, wherein said the workpiece temperature is set by the hydrogen content in container.

22. The method as claimed in claim 1, wherein said coating-material forms hard substance or friction reducing layers on said workpiece surfaces.

23. The method as claimed in claim 1, wherein said workpieces are glass or silicon wafers.

24. The method as claimed in claim 1, wherein an arc current of 80 to 170A is set for generating said beam of a plasma and wherein said workpiece surfaces are disposed at a distance r from said plasma beam axis so that $6 \text{ cm} \leq r \leq 20 \text{ cm}$.

25. The method as claimed in claim 24, wherein said distance r is set so that $9 \text{ cm} \leq r \leq 13 \text{ cm}$.

26. The method as claimed in claim 1, wherein, in said container, a total pressure $P_{tot}$ of $1 \text{ mbar} \leq P_{tot} \leq 3 \text{ mbar}$, is set.

27. The method as claimed in claim 1, wherein workpiece surfaces are disposed in a plasma density region of said plasma beam of maximally 20% of the maximum plasma density in the beam axis.

28. The method as claimed in claim 1, wherein said plasma beam is generated by one of a hot cathode or a cold cathode.

29. The method as claimed in claim 1, wherein an arc current of 80 to 170A is set for generating said beam of a plasma.

* * * * *